(12) United States Patent
Deng et al.

(10) Patent No.: US 11,296,474 B2
(45) Date of Patent: Apr. 5, 2022

(54) FLEXIBLE STRIP ASSEMBLY SYSTEM

(71) Applicants: Tyco Electronics (Shanghai) Co. Ltd., Shanghai (CN); TE Connectivity Corporation, Berwyn, PA (US)

(72) Inventors: Yingcong Deng, Shanghai (CN); Dandan Zhang, Shanghai (CN); Zhonghua Xu, Shanghai (CN); Zongjie Tao, Shanghai (CN); Roberto Francisco-Yi Lu, Bellevue, WA (US)

(73) Assignees: Tyco Electronics (Shanghai) Co. Ltd., Shanghai (CN); TE Connectivity Corporation, Berwyn, PA (US)

( * ) Notice: Subject to any disclaimer, the term of this patent is extended or adjusted under 35 U.S.C. 154(b) by 0 days.

(21) Appl. No.: 16/872,796

(22) Filed: May 12, 2020

(65) Prior Publication Data
US 2020/0366043 A1 Nov. 19, 2020

(30) Foreign Application Priority Data
May 16, 2019 (CN) .......................... 201920705642.X

(51) Int. Cl.
*H01R 43/16* (2006.01)
(52) U.S. Cl.
CPC .................................... *H01R 43/16* (2013.01)
(58) Field of Classification Search
CPC .... H01R 43/16; H05K 3/0052; H05K 1/0393; H05K 3/103; H01B 7/08; Y10T 29/49126; Y10T 29/49128; Y10T 29/4913; Y10T 29/53252
USPC ........................................... 29/830–832, 757
See application file for complete search history.

(56) References Cited

U.S. PATENT DOCUMENTS

| | | | | |
|---|---|---|---|---|
| 3,951,713 A * | 4/1976 | Emmel | ................ | H01B 7/0838 156/52 |
| 4,085,502 A * | 4/1978 | Ostman | ................ | H01B 7/08 29/843 |
| 10,189,587 B2 * | 1/2019 | Demers | ................ | H05K 1/038 |
| 2013/0213456 A1 * | 8/2013 | Schlemper | ................ | B32B 3/18 156/539 |

* cited by examiner

*Primary Examiner* — Donghai D Nguyen
(74) *Attorney, Agent, or Firm* — Barley Snyder

(57) ABSTRACT

A flexible strip assembly system includes a first conveyor conveying a first layer of material, a pick-up device picking up a conductor and placing the conductor at a predefined position on an upper surface of the first layer of material, a second conveyor conveying a second layer of material, and a first pair of guiding rollers. The conductor is conveyed under driving of the first layer of material. The first pair of guiding rollers press and stick the second layer of material to the first layer of material and the conductor on the upper surface of the first layer of material to form a flexible strip with the conductor clamped between the first layer of material and the second layer of material. At least one of the upper surface of the first layer of material and a lower surface of the second layer of material has an adhesive layer.

20 Claims, 4 Drawing Sheets

FLEXIBLE STRIP ASSEMBLY SYSTEM

CROSS-REFERENCE TO RELATED APPLICATION

This application claims the benefit of the filing date under 35 U.S.C. § 119(a)-(d) of Chinese Patent Application No. 201920705642.X, filed on May 16, 2019.

FIELD OF THE INVENTION

The present invention relates to an assembly system and, more particularly, to an assembly system for assembling a flexible strip of an electrical device.

BACKGROUND

A flexible strip is widely used as an important component to assemble an electrical connector, such as an automotive connector, a medical device, an industrial connector, and the like. A flexible strip generally includes a conductor and two layers of material (a first layer of material and a second layer of material), with the conductor wrapped between the two layers of material.

In the related art, the conductor is generally manually placed between the first layer of material and the second layer of material. One side of the first layer of material facing the second layer of material and/or one side of the second layer of material facing the first layer of material is coated with an adhesive layer. The first layer of material, the second layer of material, and the conductor are then stuck together. However, it is very time-consuming and inefficient to manually assemble the flexible strip, and the quality of the assembly is difficult to guarantee.

SUMMARY

A flexible strip assembly system includes a first conveyor conveying a first layer of material, a pick-up device picking up a conductor and placing the conductor at a predefined position on an upper surface of the first layer of material, a second conveyor conveying a second layer of material, and a first pair of guiding rollers. The conductor is conveyed under driving of the first layer of material. The first pair of guiding rollers press and stick the second layer of material to the first layer of material and the conductor on the upper surface of the first layer of material to form a flexible strip with the conductor clamped between the first layer of material and the second layer of material. At least one of the upper surface of the first layer of material and a lower surface of the second layer of material has an adhesive layer.

BRIEF DESCRIPTION OF THE DRAWINGS

The invention will now be described by way of example with reference to the accompanying Figures, of which.

DETAILED DESCRIPTION OF THE EMBODIMENT(S)

Figure 1:
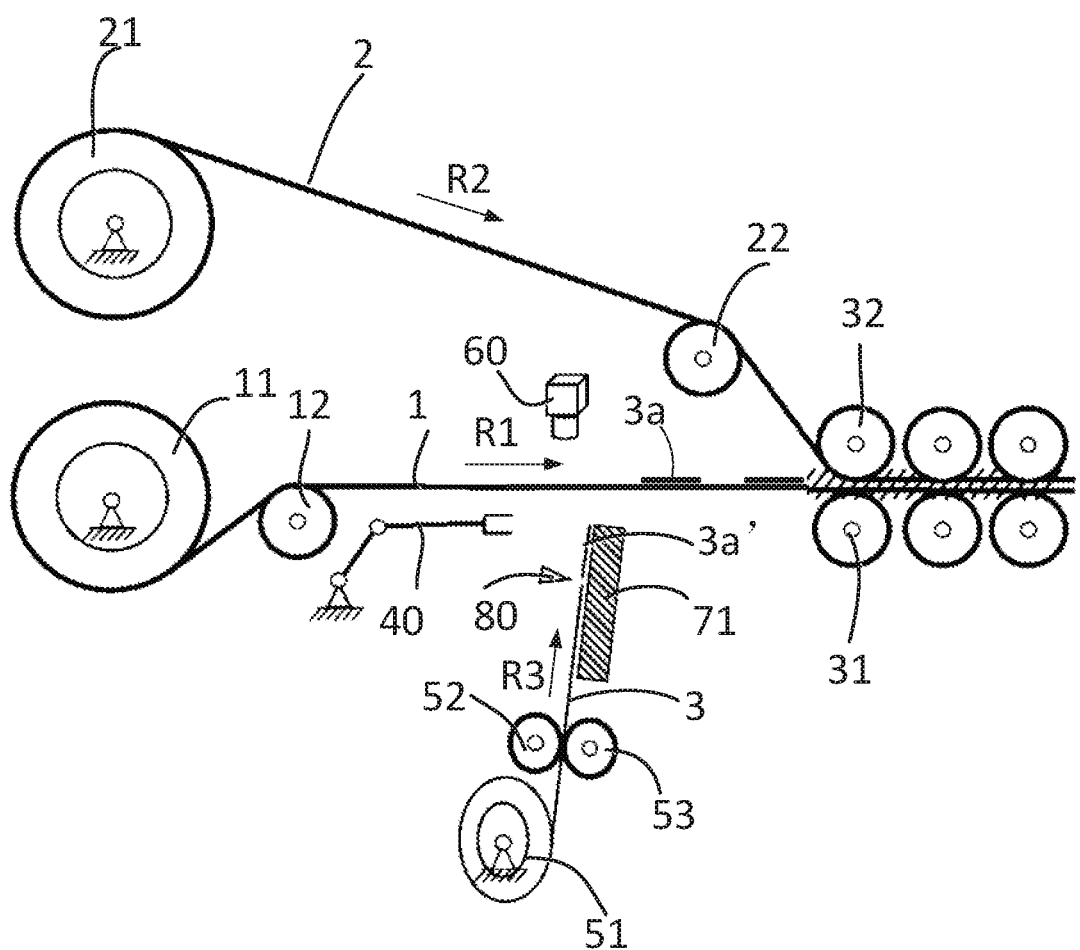
FIG. 1 is a schematic diagram of a flexible strip assembly system according to an embodiment.

Exemplary embodiments of the present disclosure will be described hereinafter in detail with reference to the attached drawings, wherein like reference numerals refer to like elements. The present disclosure may, however, be embodied in many different forms and should not be construed as being limited to the embodiments set forth herein; rather, these embodiments are provided so that the present disclosure will fully convey the concept of the disclosure to those skilled in the art.

In addition, in the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

A flexible strip assembly system according to an embodiment, as shown in FIG. 1, comprises a first conveyor, a pick-up device 40, a second conveyor, and at least one first pair of guiding rollers 31, 32.

As shown in FIG. 1, the first conveyor is adapted to convey a first layer of material 1 in a first conveying direction R1. The pick-up device 40 is adapted to pick up a conductor 3 and place the picked-up conductor 3 at a predetermined position on an upper surface of the first layer of material 1, so that the conductor 3 is transported by the first layer of material 1. The second conveyor is adapted to convey the second layer of material 2 in a second conveying direction R2.

As shown in FIG. 1, each of the at least one first pair of guiding rollers 31, 32 has a first guiding roller 31 and a second guiding roller 32 and is adapted to press and stick the second layer of material 2, conveyed by the second conveyor, against the first layer of material 1 and the conductor 3 on the upper surface of the first layer of material 1, so as to form a flexible strip in which the conductor 3 is clamped between the first layer of material 1 and the second layer of material 2. At least one of the upper surface of the first layer of material 1 and the lower surface of the second layer of material 2 is provided with an adhesive layer.

The flexible strip assembly system, as shown in FIG. 1, includes a first driving device adapted to drive the first guiding roller 31 and the second guiding roller 32 of the at least one first pair of guiding rollers 31, 32 to rotate synchronously and counter to one another to transport the flexible strip forward by the at least one first pair of guiding rollers 31, 32.

In an embodiment, as shown in FIG. 1, a gap between the first guiding roller 31 and the second guiding roller 32 is adjustable. For example, the gap between the first guiding roller 31 and the second guiding roller 32 in a vertical direction is adjustable, so that the flexible strip assembly system may be suitable for assembled flexible strips having different thicknesses. The gap between the first guiding roller 31 and the second guiding roller 32 is ensured that the first layer of material 1, the second layer of material 2, and the conductor 3 on the upper surface of the first layer of material 1 can pass through it, and the second layer of material 2, the first layer of material 1, and the conductor 3 on the upper surface of the first layer of material 1 are clamped and stuck together by the adhesive layer to form the flexible strip.

In the embodiment shown in FIG. 1, the first conveyor includes a first reel 11 on which the first layer of material 1 is wound and at least one first guiding wheel 12 located between the first reel 11 and the at least one first pair of guiding rollers 31, 32 in the first conveying direction R1 of the first layer of material 1. The first guiding wheel 12 is adapted to guide the first layer of material 1 unwound from the first reel 11. It should be noted, however, that in some other embodiments of the present disclosure, a plurality of first guiding wheels 12 may be provided to smoothly guide the first layer of material 1. In the embodiment shown in FIG. 1, because the upper surface of the first layer of material 1 is coated with the adhesive layer, when the plurality of first guiding wheels 12 are provided, the plurality of first guiding wheels 12 are all located on a lower surface of the first layer of material 1 where the adhesive layer is not provided, so as to prevent the plurality of first guiding wheels 12 from being stuck to the first layer of material 1. In addition, the plurality of first guiding wheels 12 may or may not be arranged in a straight line.

In the embodiment shown in FIG. 1, the second conveyor includes a second reel 21 on which the second layer of material 2 is wound and at least one second guiding wheel 22 located between the second reel 21 and the at least one first pair of guiding rollers 31, 32 in the second conveying direction R2 of the second layer of material 2. The second guiding wheel 22 is adapted to guide the second layer of material 2 unwound from the second reel 21. It should be noted, however, that in other embodiments of the present disclosure, a plurality of second guiding wheels 22 may be provided to smoothly guide the second layer of material 2. In an embodiment, the plurality of second guiding wheels 22 are all located on the side of the second layer of material 2 where the adhesive layer is not provided, so as to prevent the plurality of second guiding wheels 22 from being stuck to the second layer of material 2. In addition, the plurality of second guiding wheels 22 may or may not be arranged in a straight line.

Figure 2:
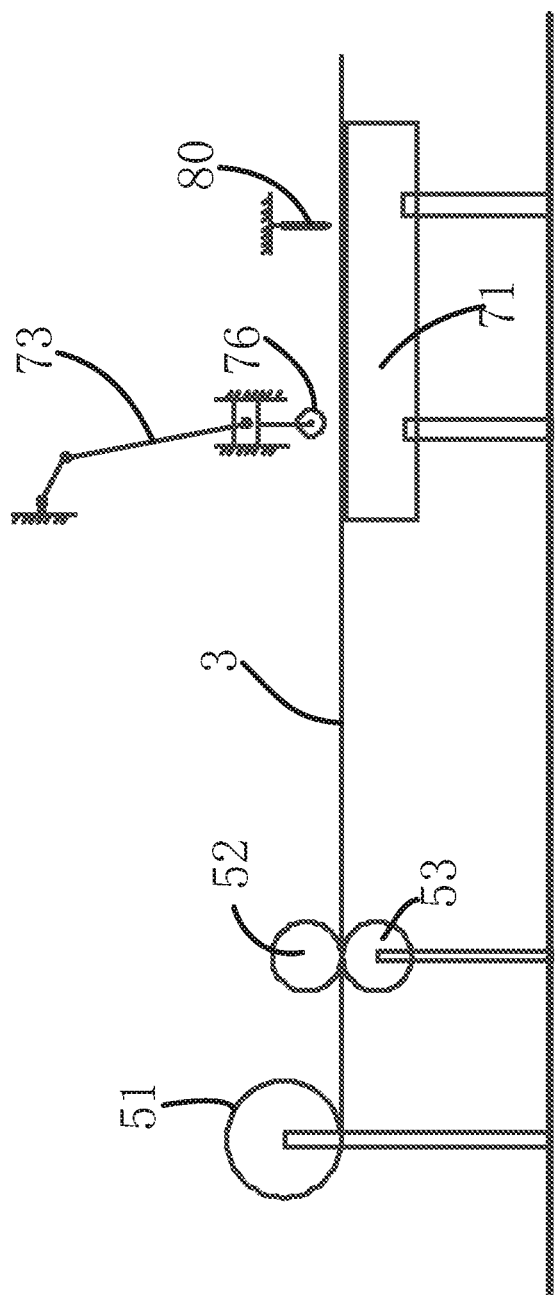
FIG. 2 is a schematic view of a third conveyer of the flexible strip assembly.
Figure 3:
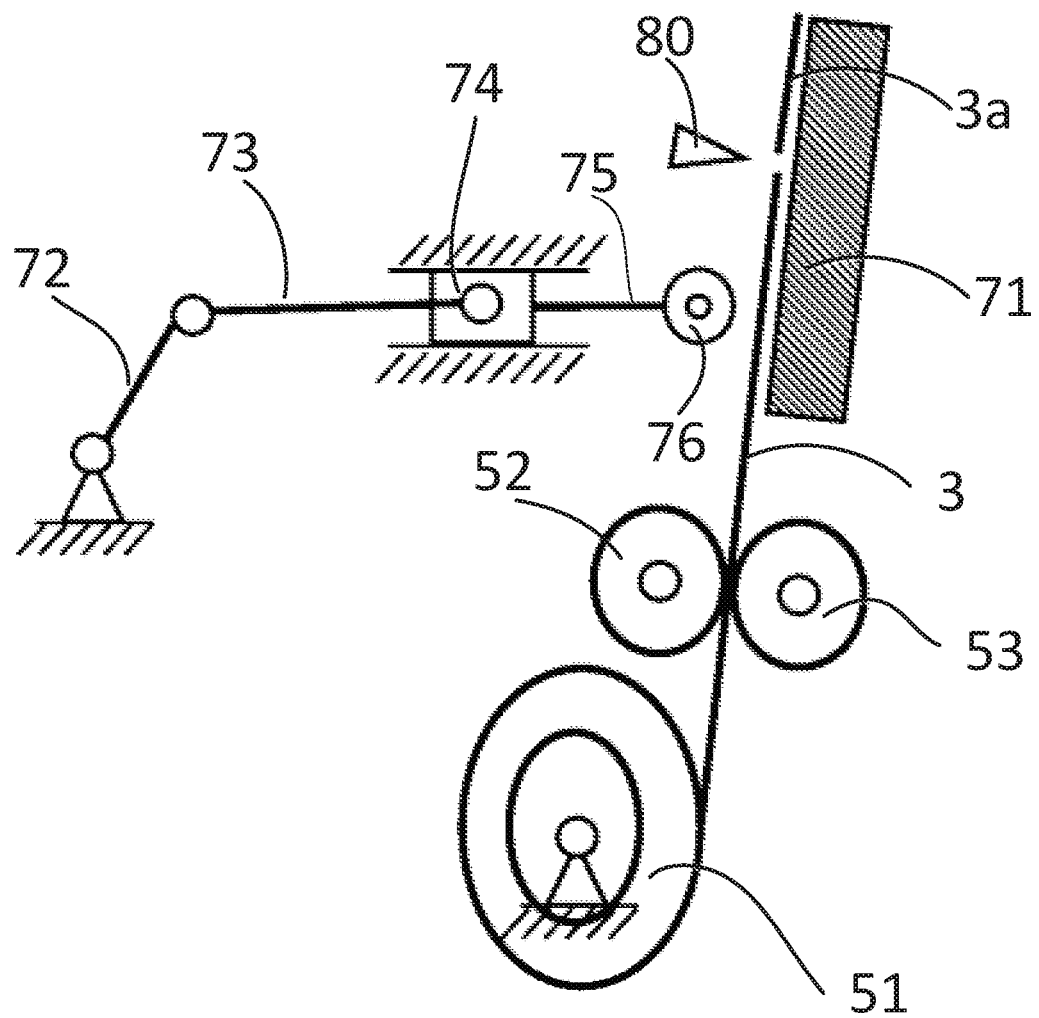
FIG. 3 is another schematic view of the third conveyer of FIG. 2.

The flexible strip assembly system, as shown in FIGS. 1-3, comprises a third conveyor including a conductor straightening unit adapted to straighten the conductor 3 to be stuck. The conductor straightening unit, as shown in the embodiments of FIGS. 1-3, includes a conductor supporting table 71 adapted to support the conductor 3 conveying in a third conveying direction R3, a pressing roller 76 adapted to press the conductor 3 against the conductor supporting table 71 to straighten the conductor 3, and a second driving device adapted to drive the pressing roller 76 to linearly reciprocate to press the conductor 3 against the conductor supporting table 71 or to separate from the conductor 3 on the conductor supporting table 71.

In the embodiment shown in FIGS. 1-3, the conductor straightening unit includes a locking mechanism configured to lock the second driving device so that the pressing roller 76 is kept in a state of pressing the conductor 3 while the pressing roller 76 presses the conductor 3 against the conductor supporting table 71.

In the embodiment shown in FIGS. 1-3, the second driving device includes a slider-crank mechanism, a connecting pole 75, a first end of the connecting pole 75 being connected to a slider 74 of the slider-crank mechanism, a pressing roller 76 rotatably connected to a second end of the connecting pole 75, and a motor adapted to drive a crank 72 of the slider-crank mechanism to rotate. When the crank 72 of the crank-slider mechanism is driven to rotate by the motor, the slider 74 is driven by the connecting rod 73 of the crank-slider mechanism to linearly reciprocate in a direction substantially perpendicular to the third conveying direction R3 of the conductor 3. However, it will be appreciated by those skilled in the art that in some other embodiments of the present disclosure, other types of driving devices, such as pneumatic cylinders or hydraulic cylinder, etc., may be used.

In the embodiment shown in FIGS. 1-3, the locking mechanism holds a rotation angle of the motor while the pressing roller 76 presses the conductor 3 against the conductor supporting table 71. That is, while the pressing roller 76 presses the conductor 3 against the conductor supporting table 71, the rotation angle of the motor is hold by the locking mechanism and the motor does not continue to rotate, which makes it possible to keep the pressing roller 76 in the state of pressing the conductor 3. When the conductor 3 is not required to be continued to be straightened, the locking mechanism is deactivated, so that the motor continues to rotate, and the pressing roller 76 is separated from the conductor 3 on the conductor supporting table 71 and is returned by the slider-crank mechanism. While the pressing roller 76 presses the conductor 3 against the conductor supporting table 71, the crank-slider mechanism is in a bottom dead point position.

Figure 4:
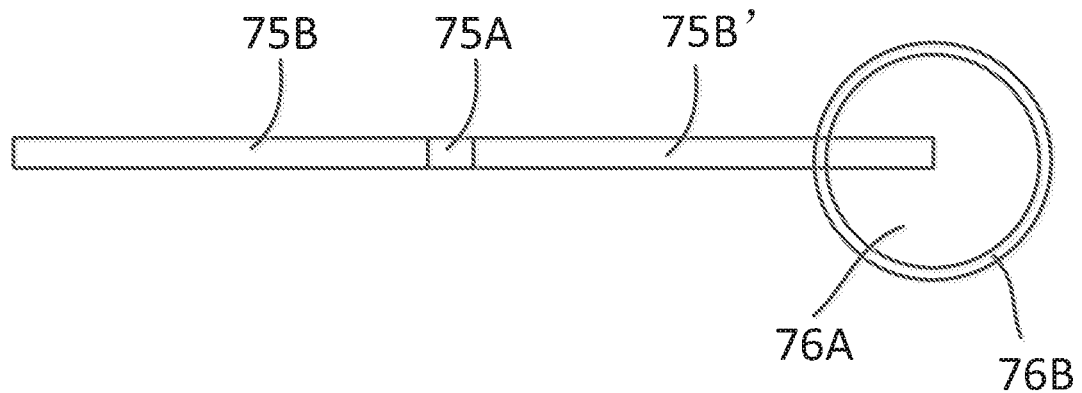
FIG. 4 is a schematic view of a connecting pole of the flexible strip assembly.

In an embodiment shown in FIG. 4, the connecting pole 75 has an elastic section 75A, a first rigid section 75B connected to a first end of the elastic section 75A, and a second rigid section 75B' connected to a second end of the elastic section 75A. In this way, the connecting pole 75 may be stretchable in its axial direction to further control a pressing force and pressing depth of the pressing roller 76 on the conductor 3.

The pressing roller 76, as shown in FIG. 4, includes a main body 76A and an elastic layer 76B provided on a circumferential surface of the main body 76A. After the pressing roller 76 is moved down to be in contact with the conductor 3 on the conductor supporting table 71 by the second driving device, the elastic layer 76B is gradually compressed to adjust the pressing force and the pressing depth on the conductor 3.

In an embodiment shown in FIGS. 1-3, the third conveyor further comprises a feeding unit including a third reel 51 on which the conductor 3 is wound and at least one second pair of guiding rollers 52, 53. Each of the at least one second pair of guiding rollers 52, 53 has a third guiding roller 52 and a fourth guiding roller 53, and is adapted to clamp the conductor 3 unwound from the third reel 51. The feeding unit further comprises a third driving device adapted to drive the third guiding roller 52 and the fourth guiding roller 53 of the at least one second pair of guiding rollers 52, 53 to rotate synchronously and counter to one another to feed the conductor 3 forward by the at least one second pair of guiding rollers 52, 53. In another embodiment, the plurality of second pairs of guiding rollers 52, 53 are provided at intervals in the conveying direction of the conductor 3.

In the embodiment shown in FIGS. 1-3, the third conveyor includes a cutting unit 80 adapted to cut the straightened conductor 3 into a predetermined length. The cutting unit 80 is adapted to cut the conductor 3 depended on a length of the conductor 3 determined by a number of rotations of the at least one second pair of guiding rollers 52, 53 and/or the third reel 51 of the feeding unit. The length of the conductor 3 is calculated based on the number of rotations of the at least one second pair of guiding rollers 52, 53 and/or the third reel 51, and when the length reaches a predetermined length, the cutting unit 80 is instructed to cut the conductor 3.

Figure 5:
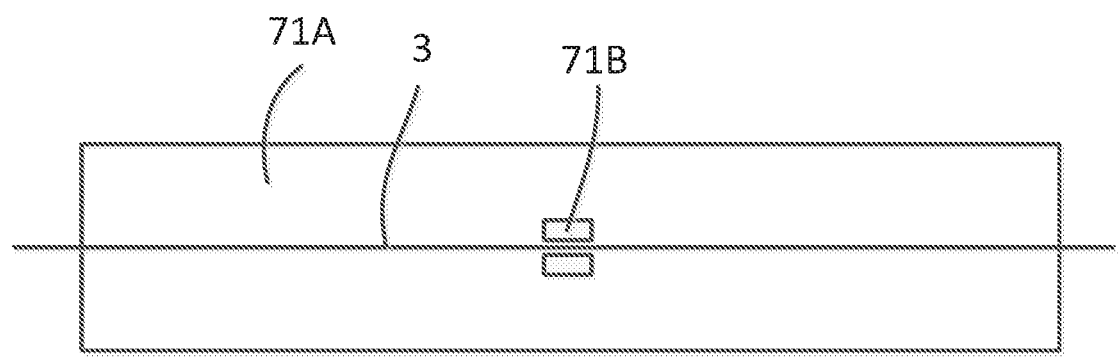
FIG. 5 is a schematic view of a conductor supporting table of the flexile strip assembly.

The conductor supporting table 71, as shown in FIG. 5, includes a base 71A, an upper surface of the base 71A being provided with a pair of holding portions 71B protruding upwardly, and a positioning groove adapted to position the conductor 3 being formed between the two holding portions 71B.

In an embodiment, as shown in FIG. 1, the flexible strip assembly system comprises a vision system 60 adapted to identify a position of the last conductor 3a that has been placed on the first layer of material 1 to guide the pick-up device 40 to place another conductor 3a' at a position spaced apart from the last conductor 3a by a predetermined distance. In this way, it is possible to control the distance between two adjacent conductors 3 placed on the first layer of material 1. For example, the distance may be constant or variable.

According to the flexible strip assembly system of the various embodiments of the disclosure, the first layer of material 1 and the second layer of material 2 are conveyed between the first guiding roller 31 and the second guiding roller 32 of the at least one first pair of guiding rollers 31, 32 by the first conveyor and the second conveyor, respectively. The conductor 3 is picked up and placed at the predetermined position of the upper surface of the first layer of material 1 by the pick-up device 40. The conductor 3 is conveyed between the first guiding roller 31 and the second guiding roller 32 of the at least one first pair of guiding rollers 31, 32 under driving of the first layer of material 1, and then the second layer of material 2 conveyed by the second conveyor is pressed and stuck to the first layer of material 1 and the conductor 3 on the upper surface of the first layer of material 1 by the at least one first pair of guiding rollers 31, 32 to form the flexible strip with the conductor 3 being clamped between the first layer of material 1 and the second layer of material 2. The flexible strip assembly system may assemble the flexible strip automatically, the assembly efficiency is high, the assembly quality is guaranteed, and the labor is saved.

It should be appreciated by those skilled in this art that the above embodiments are intended to be illustrative, and many modifications may be made to the above embodiments by those skilled in this art, and various structures described in various embodiments may be freely combined with each other without conflicting in configuration or principle.

Although the present disclosure has been described hereinbefore in detail with reference to the attached drawings, it should be appreciated that the disclosed embodiments in the attached drawings are intended to illustrate the embodiments of the present disclosure by way of example, and should not be construed as a limitation to the present disclosure.

Although several exemplary embodiments have been shown and described, it would be appreciated by those skilled in the art that various changes or modifications may be made to these embodiments without departing from the principles and spirit of the disclosure, the scope of which is defined by the claims and their equivalents.

It should be noted that, the word "comprise" doesn't exclude other elements or steps, and the word "a" or "an" doesn't exclude more than one. In addition, any reference numerals in the claims should not be interpreted as the limitation to the scope of the present disclosure.

What is claimed is:

1. A flexible strip assembly system, comprising:
a first conveyor adapted to convey a first layer of material;
a pick-up device adapted to pick up a conductor and place the conductor at a predefined position on an upper surface of the first layer of material, the conductor is conveyed under driving of the first layer of material;
a second conveyor adapted to convey a second layer of material;
a first pair of guiding rollers including a first guiding roller and a second guiding roller, the first pair of guiding rollers adapted to press and stick the second layer of material to the first layer of material and the conductor on the upper surface of the first layer of material to form a flexible strip with the conductor clamped between the first layer of material and the second layer of material, at least one of the upper surface of the first layer of material and a lower surface of the second layer of material has an adhesive layer; and
a third conveyor including a conductor straightening unit adapted to straighten the conductor, the conductor straightening unit having a pressing roller pressing the conductor against a fixed pressing surface of the conductor straightening unit to straighten the conductor.

2. The flexible strip assembly system of claim 1, wherein a gap between the first guiding roller and the second guiding roller is adjustable.

3. The flexible strip assembly system of claim 1, wherein the first conveyor includes a first reel on which the first layer of material is wound and a first guiding wheel between the first reel and the first pair of guiding rollers in a conveying direction of the first layer of material, the first guiding wheel adapted to guide the first layer of material unwound from the first reel.

4. The flexible strip assembly system of claim 1, wherein the second conveyor includes a second reel on which the second layer of material is wound and a second guiding wheel between the second reel and the first pair of guiding rollers in a conveying direction of the second layer of material, the second guiding wheel adapted to guide the second layer of material unwound from the second reel.

5. The flexible strip assembly system of claim 1, wherein the third conveyor includes a feeding unit with a third reel on which the conductor is wound and a second pair of guiding rollers adapted to clamp the conductor unwound from the third reel.

6. The flexible strip assembly system of claim 5, wherein a plurality of second pairs of guiding rollers are disposed at intervals in a conveying direction of the conductor.

7. The flexible strip assembly system of claim 5, wherein the third conveyor has a cutting unit adapted to cut the conductor to a predetermined length.

8. The flexible strip assembly system of claim 7, wherein the cutting unit cuts the conductor depending on a length of the conductor determined by a number of rotations of the second pair of guiding rollers and/or the third reel.

9. The flexible strip assembly system of claim 5, wherein the second pair of guide rollers oppose one another in a direction perpendicular to a direction of elongation of the conductor unwound from the third reel, the conductor clamped between the second pair of guide rollers.

10. The flexible strip assembly system of claim 1, wherein the conductor straightening unit further includes a driving device for selectively driving the pressing roller linearly to press the conductor against the pressing surface.

11. The flexible strip assembly system of claim 10, wherein the conductor straightening unit includes a locking mechanism configured to hold the driving device so that the pressing roller is kept in a state of pressing the conductor while the pressing roller presses the conductor against the pressing surface.

12. The flexible strip assembly system of claim 11, wherein the driving device includes a slider-crank mechanism, a connecting pole having a first end connected to a slide of the slider-crank mechanism and a second end rotatably connected to the pressing roller, and a motor adapted to drive a crank of the slider-crank mechanism to rotate.

13. The flexible strip assembly system of claim 12, wherein the locking mechanism holds a rotation angle of the motor while the pressing roller presses the conductor against the pressing surface.

14. The flexible strip assembly system of claim 13, wherein the slider-crank mechanism is in a bottom dead point position while the pressing roller presses the conductor against the pressing surface.

15. The flexible strip assembly system of claim 12, wherein the connecting pole has an elastic section, a first rigid section connected to a first end of the elastic section, and a second rigid section connected to a second end of the elastic section.

16. The flexible strip assembly system of claim 10, wherein the driving device includes a connecting arm having a first end for operatively connecting to a motor, and a second end connected to the pressing roller, the connecting arm having an elastic section for varying a length of the connecting arm in an axial direction thereof.

17. A flexible strip assembly system, comprising:
a first conveyor adapted to convey a first layer of material;
a pick-up device adapted to pick up a conductor and place the conductor at a predefined position on an upper surface of the first layer of material, the conductor is conveyed under driving of the first layer of material;
a second conveyor adapted to convey a second layer of material;
a first pair of guiding rollers including a first guiding roller and a second guiding roller, the first pair of guiding rollers adapted to press and stick the second layer of material to the first layer of material and the conductor on the upper surface of the first layer of material to form a flexible strip with the conductor clamped between the first layer of material and the second layer of material, at least one of the upper surface of the first layer of material and a lower surface of the second layer of material has an adhesive layer; and
a third conveyor including a conductor straightening unit adapted to straighten the conductor, the conductor straightening unit includes a conductor supporting table adapted to support the conductor, a pressing roller adapted to press the conductor against the conductor supporting table to straighten the conductor, and a driving device adapted to drive the pressing roller to reciprocate linearly to press the conductor against the conductor supporting table or separate from the conductor on the conductor supporting table.

18. The flexible strip assembly system of claim 17, wherein the pressing roller has a main body and an elastic layer on a circumferential surface of the main body.

19. The flexible strip assembly system of claim 17, wherein the conductor supporting table has a base, an upper surface of the base has a pair of holding portions protruding upwardly and a positioning groove adapted to position the conductor between the holding portions.

20. A flexible strip assembly system, comprising:
a first conveyor adapted to convey a first layer of material;
a pick-up device adapted to pick up a conductor and place the conductor at a predefined position on an upper surface of the first layer of material, the conductor is conveyed under driving of the first layer of material;
a second conveyor adapted to convey a second layer of material;
a first pair of guiding rollers including a first guiding roller and a second guiding roller, the first pair of guiding rollers adapted to press and stick the second layer of material to the first layer of material and the conductor on the upper surface of the first layer of material to form a flexible strip with the conductor clamped between the first layer of material and the second layer of material, at least one of the upper surface of the first layer of material and a lower surface of the second layer of material has an adhesive layer; and
a vision system adapted to identify a position of a last conductor that has been placed on the first layer of material to guide the pick-up device to place another conductor at a position spaced apart from the last conductor by a predetermined distance.

* * * * *